(12) United States Patent
DiCarlo et al.

(10) Patent No.: US 7,871,931 B2
(45) Date of Patent: Jan. 18, 2011

(54) METHOD FOR CHEMICAL MECHANICAL PLANARIZATION OF A METAL LAYER LOCATED OVER A PHOTORESIST LAYER AND A METHOD FOR MANUFACTURING A MICRO PIXEL ARRAY USING THE SAME

(75) Inventors: Anthony DiCarlo, Richardson, TX (US); Jingqiu Chen, Dallas, TX (US); Yanghua He, Richardson, TX (US); James C. Baker, Coppell, TX (US); David A. Rothenbury, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 1520 days.

(21) Appl. No.: 11/231,249

(22) Filed: Sep. 20, 2005

(65) Prior Publication Data

US 2007/0066063 A1 Mar. 22, 2007

(51) Int. Cl.
*H01L 21/302* (2006.01)
(52) U.S. Cl. .................. 438/689; 438/691; 438/692; 438/693; 216/89
(58) Field of Classification Search .............. 216/89; 438/691, 692, 693
See application file for complete search history.

(56) References Cited

U.S. PATENT DOCUMENTS

| | | | | |
|---|---|---|---|---|
| 5,457,493 A * | 10/1995 | Leddy et al. | ................. | 348/164 |
| 5,506,171 A * | 4/1996 | Leonard et al. | ................. | 216/2 |
| 5,620,357 A * | 4/1997 | Misaka et al. | ................. | 451/9 |
| 5,638,354 A * | 6/1997 | Nakayama et al. | ........ | 369/275.3 |
| 6,099,132 A * | 8/2000 | Kaeriyama | ................. | 359/872 |
| 6,525,369 B1 * | 2/2003 | Wu | ................. | 257/315 |
| 6,528,843 B1 * | 3/2003 | Wu | ................. | 257/315 |
| 6,531,734 B1 * | 3/2003 | Wu | ................. | 257/315 |
| 6,552,386 B1 * | 4/2003 | Wu | ................. | 257/317 |
| 6,710,396 B1 * | 3/2004 | Wu | ................. | 257/315 |
| 6,870,660 B2 | 3/2005 | DiCarlo | | |
| 6,962,419 B2 * | 11/2005 | Huibers | ................. | 353/99 |
| 7,006,275 B2 * | 2/2006 | Huibers | ................. | 359/290 |
| 7,012,731 B2 * | 3/2006 | Huibers | ................. | 359/290 |
| 7,018,052 B2 * | 3/2006 | Huibers | ................. | 353/99 |
| 7,023,606 B2 * | 4/2006 | Huibers | ................. | 359/290 |
| 7,052,972 B2 * | 5/2006 | Sandhu et al. | ............. | 438/445 |
| 7,167,297 B2 * | 1/2007 | Huibers | ................. | 359/290 |
| 7,172,296 B2 * | 2/2007 | Huibers | ................. | 353/99 |
| 7,196,740 B2 * | 3/2007 | Huibers | ................. | 348/744 |
| 7,262,817 B2 * | 8/2007 | Huibers | ................. | 348/771 |
| 7,300,162 B2 * | 11/2007 | Huibers | ................. | 353/99 |
| 7,413,962 B2 * | 8/2008 | Sandhu et al. | ............. | 438/445 |
| 2003/0129782 A1 | 7/2003 | Robbins | | |
| 2004/0082275 A1 * | 4/2004 | Mahulikar et al. | ............ | 451/41 |
| 2004/0125346 A1 * | 7/2004 | Huibers | ................. | 353/98 |
| 2004/0160659 A1 * | 8/2004 | DiCarlo | ................. | 359/291 |
| 2004/0218149 A1 * | 11/2004 | Huibers | ................. | 353/50 |

(Continued)

*Primary Examiner*—Allan Olsen
(74) *Attorney, Agent, or Firm*—Charles A. Brill; Wade James Brady, III; Frederick J. Telecky, Jr.

(57) ABSTRACT

The present invention provides a method for planarizing a metal layer, and a method for manufacturing a micro pixel array. The method for planarizing the metal layer, without limitation, may include the steps of forming a metal layer over a photoresist layer, and then planarizing the metal layer using a chemical mechanical planarization process.

22 Claims, 4 Drawing Sheets

U.S. PATENT DOCUMENTS

| | | | | |
|---|---|---|---|---|
| 2004/0218154 A1* | 11/2004 | Huibers | ...................... | 353/97 |
| 2004/0218292 A1* | 11/2004 | Huibers | ...................... | 359/850 |
| 2004/0218293 A1* | 11/2004 | Huibers | ...................... | 359/850 |
| 2004/0223088 A1* | 11/2004 | Huibers | ...................... | 348/771 |
| 2004/0223240 A1* | 11/2004 | Huibers | ...................... | 359/850 |
| 2004/0233392 A1* | 11/2004 | Huibers | ...................... | 353/31 |
| 2005/0007557 A1* | 1/2005 | Huibers | ...................... | 353/31 |
| 2006/0268391 A1* | 11/2006 | DiCarlo | ...................... | 359/291 |
| 2007/0285757 A1* | 12/2007 | DiCarlo et al. | .............. | 359/224 |

* cited by examiner

METHOD FOR CHEMICAL MECHANICAL PLANARIZATION OF A METAL LAYER LOCATED OVER A PHOTORESIST LAYER AND A METHOD FOR MANUFACTURING A MICRO PIXEL ARRAY USING THE SAME

TECHNICAL FIELD OF THE INVENTION

The present invention is directed, in general, to a chemical mechanical planarization process and, more specifically, to a method for chemical mechanical planarization of a metal layer located over a photoresist layer and a method for manufacturing a micro pixel array using the same.

BACKGROUND OF THE INVENTION

A Digital Micromirror Device (DMD) is a type of microelectromechanical systems (MEMS) device. Invented in 1987 at Texas Instruments Incorporated, the DMD is a fast, reflective digital light switch. It can be combined with image processing, memory, a light source, and optics to form a digital light processing® system capable of projecting large, bright, high-contrast color images.

The DMD is fabricated using complementary metal oxide semiconductor (CMOS) like processes over a CMOS memory. It has an array of individually addressable mirror elements, each having an aluminum mirror that can reflect light in one of two directions depending on the state of an underlying memory cell. With the memory cell in a first state, the mirror rotates to +12 degrees. With the memory cell in a second state, the mirror generally rotates to −12 degrees. By combining the DMD with a suitable light source and projection optics, the mirror reflects incident light either into or out of the pupil of the projection lens. Thus, the first state of the mirror appears bright and the second state of the mirror appears dark. Gray scale is achieved by binary pulse width modulation of the incident light. Color is achieved by using color filters, either stationary or rotating, in combination with one, two, or three DMD chips.

DMD's may have a variety of designs, and the most popular design in current use is a structure consisting of a mirror that is rigidly connected to an underlying yoke. The yoke in turn is connected by two thin, mechanically compliant torsion hinges to support posts that are attached to the underlying substrate. Electrostatic fields developed between the underlying memory cell and the mirror cause rotation in the positive or negative rotation direction.

The fabrication of the above-described DMD superstructure begins with a completed CMOS memory circuit. Through the use of photoresist layers, the superstructure is formed with alternating layers of aluminum for the address electrode, hinge, yoke, and mirror layers and hardened photoresist for sacrificial layers that form air gaps.

Planarization, or smoothness of surfaces within the DMD is critical. For example, it is critical that the surface of the mirror layer be as smooth as possible. Without a smooth mirror layer, the contrast ratio of the DMD (i.e., the difference between the whites and blacks when the mirror is in the on and off positions) may be reduced.

Accordingly, what is needed in the art is a method for providing a smooth mirror layer, such that increased contrast ratios may be obtained.

SUMMARY OF THE INVENTION

To address the above-discussed deficiencies of the prior art, the present invention provides a method for planarizing a metal layer, and a method for manufacturing a micro pixel array. The method for planarizing the metal layer, without limitation, may include the steps of forming a metal layer over a photoresist layer, and then planarizing the metal layer using a chemical mechanical planarization process.

As briefly mentioned, the present invention also discloses a method for manufacturing a micro pixel array. This method, among other steps, may include: 1) forming control circuitry on or in a semiconductor substrate, 2) forming a hinge over the control circuitry, 3) forming a photoresist layer over the hinge, 4) forming a metal layer over the photoresist layer, the metal layer having a surface roughness, and 5) planarizing the metal layer using a chemical mechanical planarization process, the planarizing reducing the surface roughness.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

The invention is best understood from the following detailed description when read with the accompanying FIGUREs. It is emphasized that in accordance with the standard practice in the semiconductor industry, various features are not drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

The present invention is based, at least in part, on the unique recognition that a metal layer formed on a photoresist layer may be planarized using a chemical mechanical planarization (CMP) process without destroying the metal layer. Prior to the unique recognition of the present invention, it was believed that subjecting any metal layer located on a photoresist layer to the CMP process would shear the metal layer from the photoresist layer, thereby destroying it. For this reason, the aforementioned metal layers were never subjected to CMP processes. Accordingly, without the aforementioned unique recognition, it would be counterintuitive to planarize a metal layer located on a photoresist layer using a CMP process. It should be noted at this point in the discussion, that the term "planarize" as used throughout this document may include planarizing and/or polishing.

Turning now to FIGS. 1-9 illustrated are cross-sectional views illustrating how one skilled in the art might manufacture a micro pixel array in accordance with the principles of the present invention. Also discussed within the embodiments of FIGS. 1-9 is how one skilled in the art might planarize a metal layer in accordance with the principles of the present invention. While each of these ideas is discussed and illustrated using a single set of drawings, neither should be limiting on the other.

Figure 1:
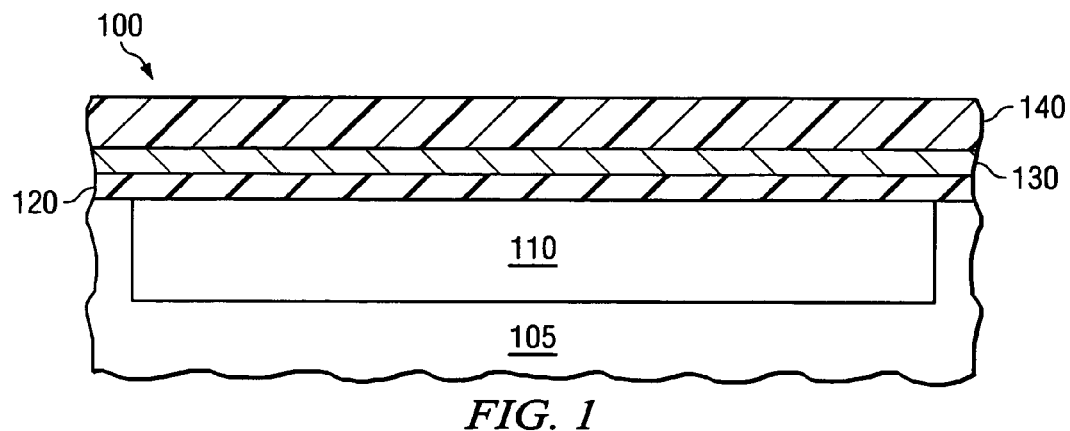
FIG. 1 illustrates a cross-sectional view of a micro pixel array at an initial stage of manufacture.

Turning initially to FIG. 1, illustrated is a cross-sectional view of a micro pixel array 100 at an initial stage of manufacture. The micro pixel array 100 illustrated in FIG. 1 includes control circuitry 110 formed on or in a semiconductor substrate 105. The semiconductor substrate 105, in an exemplary embodiment, may comprise a number of different materials while staying within the scope of the present invention. In the embodiment illustrated in FIG. 1, however, the semiconductor substrate 105 is epitaxial silicon.

The control circuitry 110 preferably comprises a plurality of CMOS devices, and more preferably, addressable static random access memory (SRAM) circuits within the semiconductor substrate 105. Nevertheless, other embodiments may exist wherein additional or different circuitry may be included within the control circuitry 110 located on or in the semiconductor substrate 105.

The micro pixel array 100 may further include an insulating layer 120 formed over the control circuitry 110. The insulating layer 120 preferably comprises an oxide such as silicon oxide that has been planarized by chemical mechanical planarization. Without being limited to such, the insulating layer 120 may have a thickness ranging from about 10 nm to about 100 nm. As the steps required to form the insulating layer 120 are conventional, no further detail is warranted.

Located over the insulating layer 120 is a conductive layer 130. The conductive layer 130 preferably comprises aluminum or aluminum alloy that has been sputter deposited to a thickness ranging from about 100 nm to about 400 nm. While not shown in the illustrated cross-section, vias are formed in the insulating layer 130 to allow the conductive layer 130 to contact the underlying control circuitry 110 where necessary. While also not shown in the illustrated cross-section, the conductive layer 130 is patterned, resulting in electrode pads and a bias bus. Preferably the conductive layer 130 is patterned by plasma-etching using plasma-deposited silicon dioxide as the etch mask.

Located over the patterned conductive layer 130 and the control circuitry 110 is an initial spacer layer 140. Preferably the initial spacer layer 140 is formed by spin depositing a photoresist to a thickness ranging from about 400 nm to about 1500 nm. The initial spacer layer 140 is configured to provide a planar surface on which to build the hinge, and to provide a gap between the hinge and the electrode pads and bias bus located thereunder.

Figure 2:
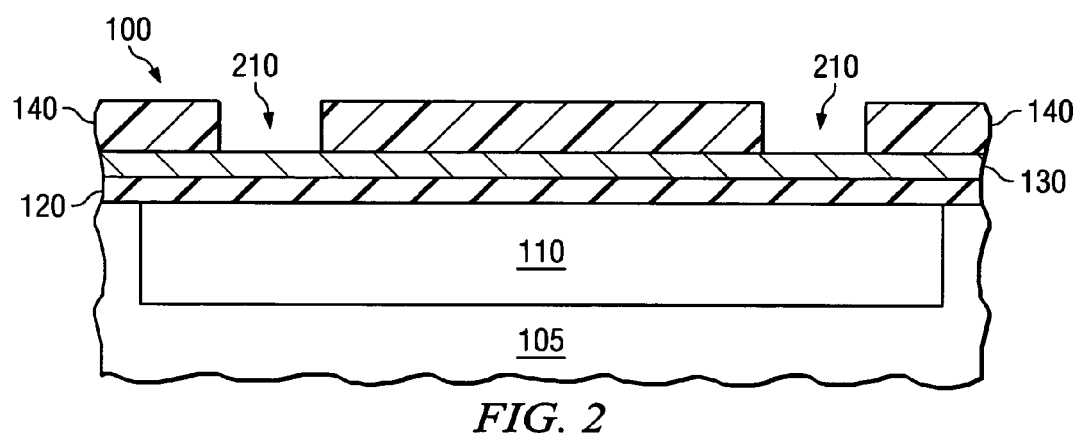
FIG. 2 illustrates a cross-sectional view of the partially completed micro pixel array illustrated in FIG. 1 after patterning openings within the initial spacer layer.

Turning now to FIG. 2, illustrated is a cross-sectional view of the partially completed micro pixel array 100 illustrated in FIG. 1 after patterning openings 210 within the initial spacer layer 140. Conventional patterning and etching techniques are used to form the openings 210 in the initial spacer layer 140. For example, the openings 210 may be patterned into the initial spacer layer 140 by exposing, patterning, developing and then descuming the initial spacer layer 140. After patterning the openings 210 in the initial spacer layer 140, the initial spacer layer 140 may be deep UV hardened to a temperature of about 200° C. to prevent flow and bubbling during subsequent processing steps.

Figure 3:
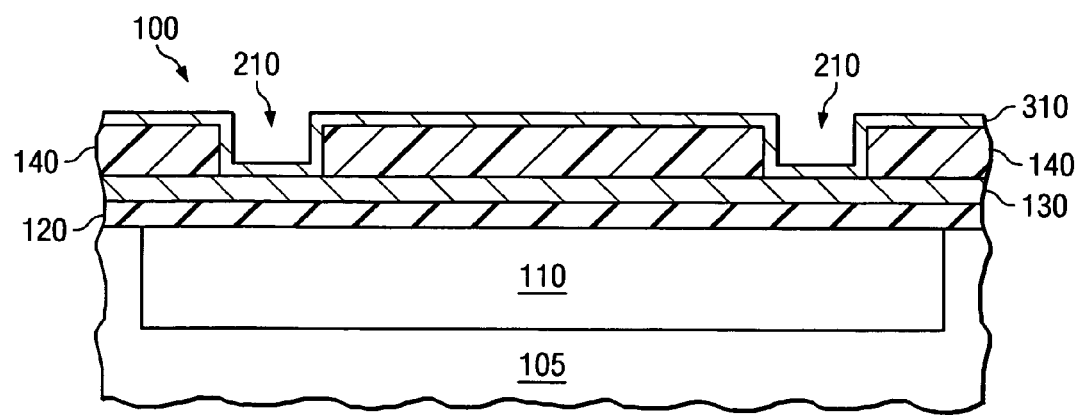
FIG. 3 illustrates a cross-sectional view of the partially completed micro pixel array illustrated in FIG. 2 after forming an initial metal layer over and within the openings in the initial spacer layer.

Turning now to FIG. 3, illustrated is a cross-sectional view of the partially completed micro pixel array 100 illustrated in FIG. 2 after forming an initial metal layer 310 over and within the openings 210 in the initial spacer layer 140. The initial metal layer 310, in accordance with the principles of the present invention, is also referred to as a hinge or binge metal layer. Preferably the initial metal layer 310 is formed using similar procedures and materials as described above for the conductive layer 130. The initial metal layer 310 typically has a desirable thickness ranging from about 30 nm to about 100 nm.

In a step not illustrated in FIG. 3, an optional via plug may be deposited over the surface of the initial metal layer 310. For example, a thick (e.g., around 500 nm) oxide could be blanket deposited over the entire surface of the initial metal layer 310. Thereafter, a via plug etch-back could be performed, thus leaving a layer of via plug material along the sidewalls of the initial metal layer 310 located in the openings 210. It is believed that the remaining via plug material provides structural support for the micro pixel array 100.

Figure 4:
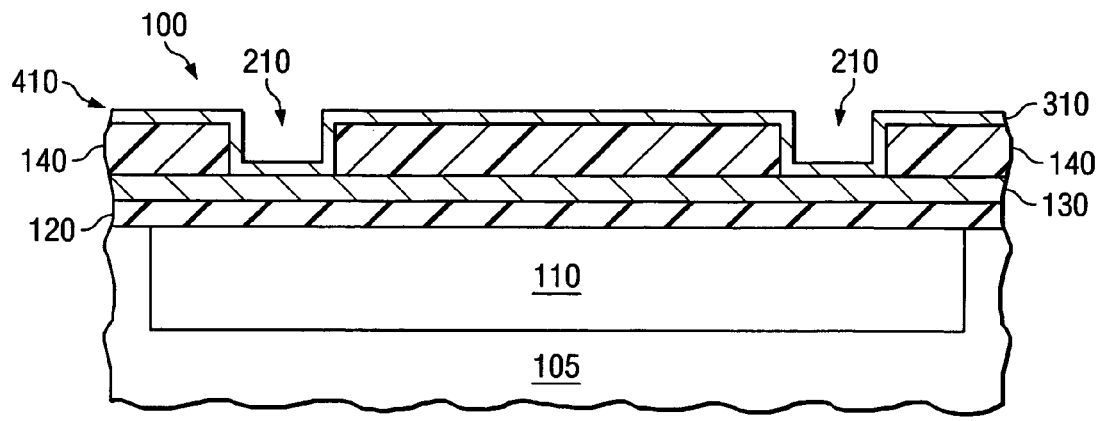
FIG. 4 illustrates a cross-sectional view of the partially completed micro pixel array illustrated in FIG. 3 after patterning the initial metal layer resulting in the hinge.

Turning now to FIG. 4, illustrated is a cross-sectional view of the partially completed micro pixel array 100 illustrated in FIG. 3 after patterning the initial metal layer 310 resulting in the hinge 410. While not illustrated, a spring may also result from the patterning process in certain embodiments. While the patterned features in the initial metal layer 310 are not illustrated in the cross-sectional view illustrated in FIG. 4, those skilled in the art understand that such features do indeed exist. As those skilled in the art appreciate, an etch mask, such as a plasma-deposited silicon dioxide etch mask, may be formed over the initial metal layer 310 to assist in the etching of the initial metal layer 310 to form the hinge 410.

Figure 5:
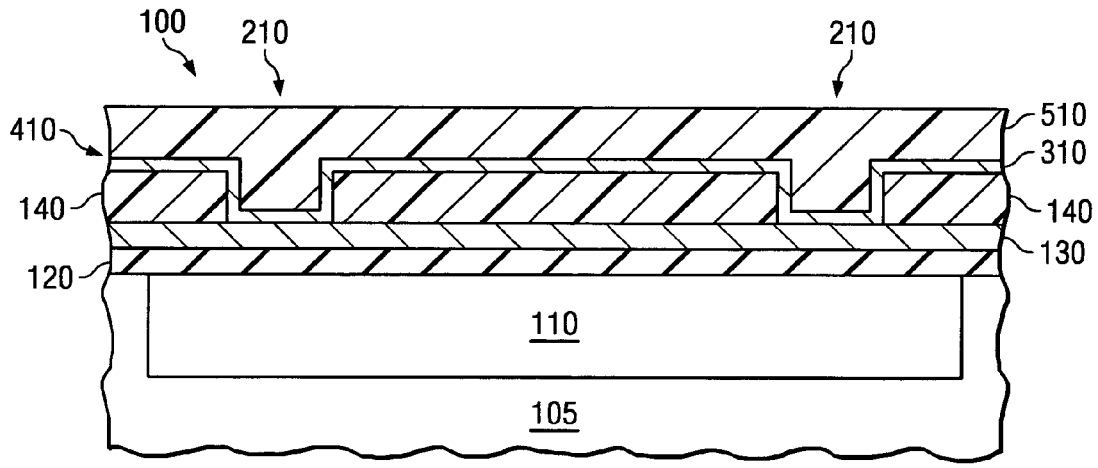
FIG. 5 illustrates a cross-sectional view of the partially completed micro pixel array illustrated in FIG. 4 after forming a photoresist layer over the hinge.

Turning now to FIG. 5, illustrated is a cross-sectional view of the partially completed micro pixel array 100 illustrated in FIG. 4 after forming a photoresist layer 510 over the hinge 410. The photoresist layer 510, in the embodiment of FIG. 5, acts as a second spacer layer. Again, similar procedures and materials may be used to form the photoresist layer 510 as described for the initial spacer layer 140. The photoresist layer 510 provides a planar surface on which to build subsequent layers.

Figure 6:
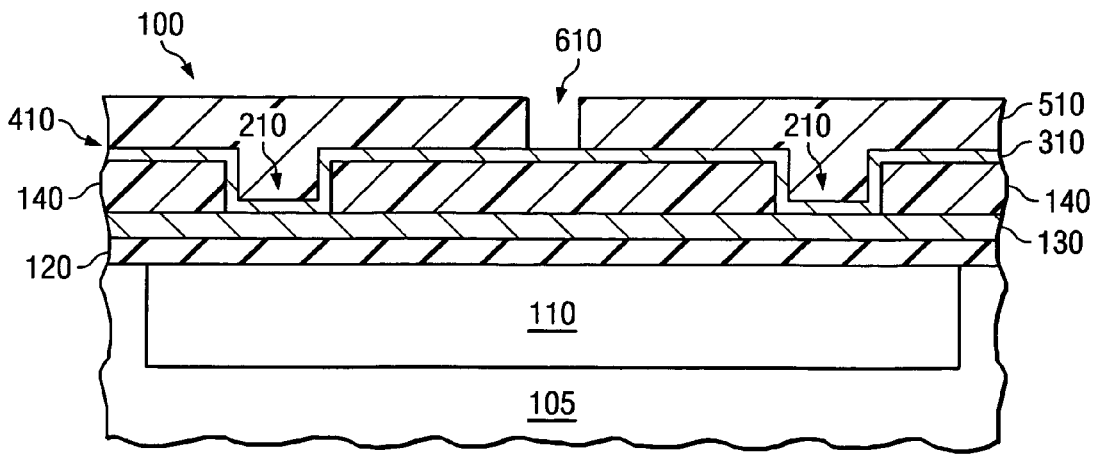
FIG. 6 illustrates a cross-sectional view of the partially completed micro pixel array illustrated in FIG. 5 after patterning an opening within the photoresist layer.

Turning now to FIG. 6, illustrated is a cross-sectional view of the partially completed micro pixel array 100 illustrated in FIG. 5 after patterning an opening 610 within the photoresist layer 510. In the embodiment of FIG. 6, the opening 610 is patterned in a center of the photoresist layer 510 using a process similar to that used to pattern the openings in the initial spacer layer 140. Accordingly, conventional patterning and etching steps may be used.

Figure 7:
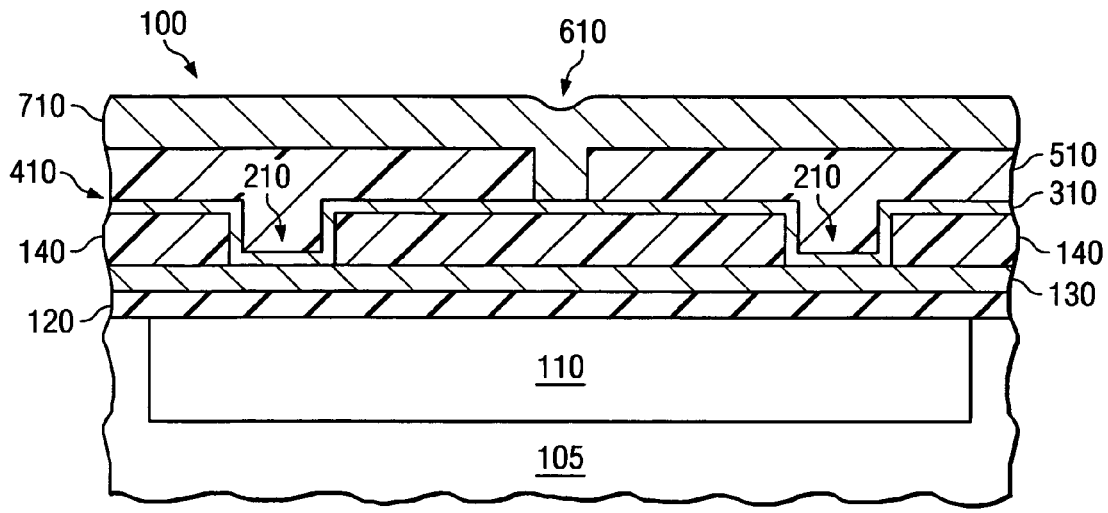
FIG. 7 illustrates a cross-sectional view of the partially completed micro pixel array illustrated in FIG. 6 after forming a metal layer over the photoresist layer.

Turning now to FIG. 7, illustrated is a cross-sectional view of the partially completed micro pixel array 100 illustrated in FIG. 6 after forming a metal layer 710 over the photoresist layer 510. In the embodiment of FIG. 7, the metal layer 710 is deposited on the photoresist layer 510, as well as in the opening 610 in the photoresist layer 510. The metal layer 710 advantageously has a thickness greater than that which it will ultimately have. For example, the metal layer 710 may be deposited to have a thickness ranging from about 500 nm to about 2000 nm, and more particularly a thickness ranging from about 550 nm to about 1000 nm, knowing that the thickness will be reduced in the following planarization step. Preferably the metal layer 710 is formed using similar procedures and materials as described above for the initial metal layer 310.

Figure 8:
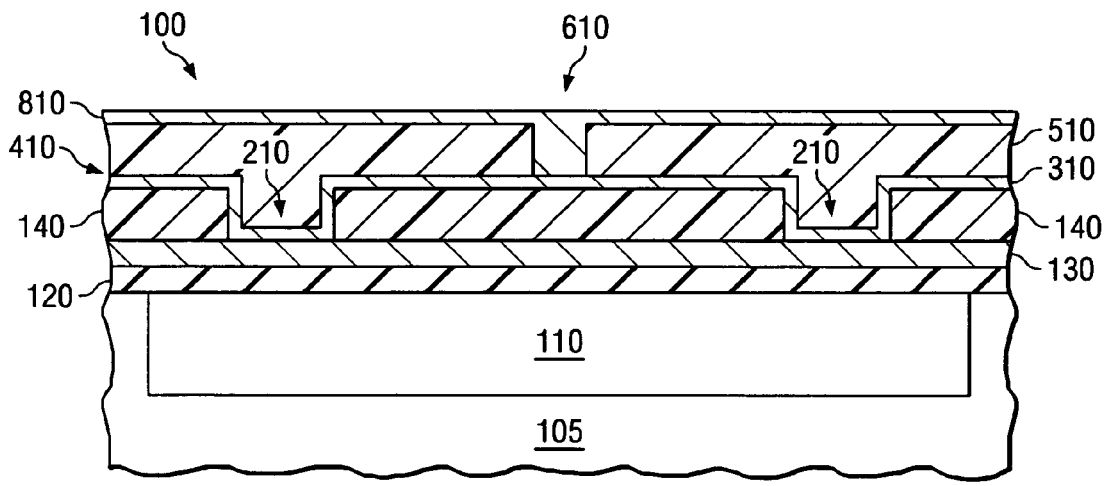
FIG. 8 illustrates a cross-sectional view of the partially completed micro pixel array illustrated in FIG. 7 after planarizing the metal layer, thereby resulting in a planarized metal layer having a surface roughness less than the metal layer.

Turning now to FIG. 8, illustrated is a cross-sectional view of the partially completed micro pixel array 100 illustrated in FIG. 7 after planarizing the metal layer 710, thereby resulting in a planarized metal layer 810 having a surface roughness less than the metal layer 710. In an exemplary embodiment, the metal layer 710 is planarized until the planarized metal layer 810 has a thickness ranging from about 200 nm to about 400 nm.

The planarizing of the metal layer 710 should be conducted very carefully. As indicated above, prior to the present invention, those skilled in the art believed it impossible to planarize a metal layer located on or over a photoresist layer. The present invention recognized, however, if conducted carefully and with the appropriate conditions, the metal layer 710 could be planarized without shearing the metal layer 710 from the photoresist layer 510.

Without being limited to such, it is believed that the down force is the most important planarizing parameter when planarizing the metal layer 710 located on or over the photoresist layer 510. In one embodiment of the present invention, it was observed that a down force of less than about 4.0 psi could be used without destroying the metal layer 710. In another exemplary embodiment of the present invention, however, it was observed that a down force ranging from about 0.5 psi to about 2.0 psi was optimal. In addition to the down force, the platen speed, wafer carrier speed, platen and slurry temperature, slurry flow rate and composition, and polishing pads, etc. can be adjusted to further prevent the metal layer 710 from shearing. It should be noted that the opening in the photoresist layer 510 with the metal layer 710 located therein further helps reduce the aforementioned shearing.

Accordingly, the planarizing of the metal layer 710 provides various advantages. First, the planarizing of the metal layer 710 reduces the surface roughness thereof. Therefore, the planarized metal layer 810 does not experience the scatter, and thus reduced contrast ratio, during the operation of the micro pixel array 100. Additionally, the planarizing of the metal layer 710 allows the manufacturer of the micro pixel array 100 to precisely tailor the thickness of the planarized metal layer 810.

Figure 9:
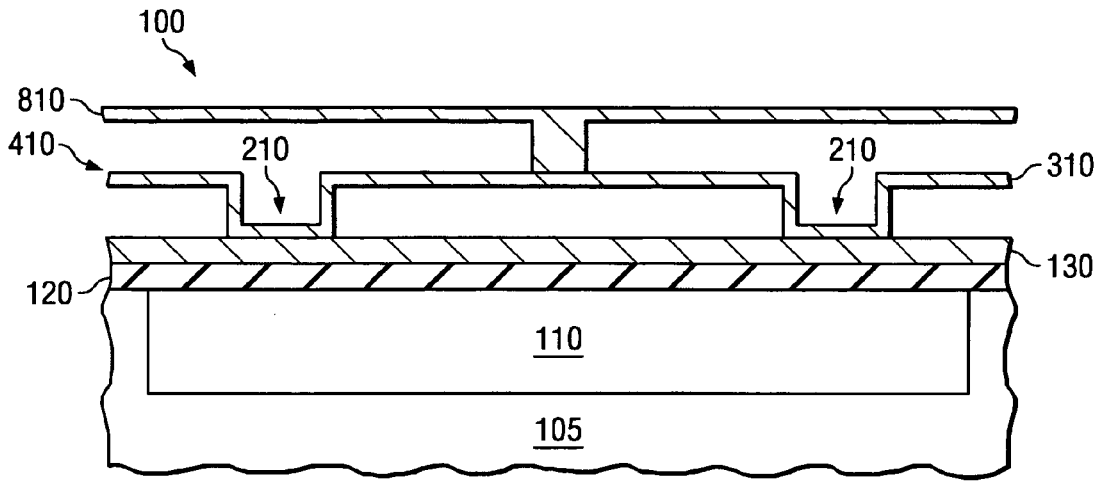
FIG. 9 illustrates a cross-sectional view of the partially completed micro pixel array illustrated in FIG. 8 after patterning the planarized metal layer and then removing the initial spacer layer and the photoresist layer.

Turning now to FIG. 9, illustrated is a cross-sectional view of the partially completed micro pixel array 100 illustrated in FIG. 8 after patterning the planarized metal layer 810 and then removing the initial spacer layer 140 and the photoresist layer 510. As those skilled in the art appreciate, an etch mask, such as a plasma-deposited silicon dioxide etch mask, may be used to assist in the etching of the planarized metal layer 810. What results is an array of reflective surfaces or mirrors.

The removal of the initial spacer layer 140 and the photoresist layer 510 is conventional. For example, a conventional plasma ashing or other similar process may be used to remove the initial spacer layer 140 and the photoresist layer 510. Nevertheless, other known or hereafter discovered processes could also be used while staying within the scope of the present invention.

The embodiment of present invention described above with respect to FIGS. 1-9 focuses on an embodiment wherein the metal layer 710 located on or over the photoresist layer 510 is planarized. Nevertheless, as those skilled in the art appreciate, other embodiment for planarizing a metal layer located on or over a photoresist layer exist and remain within the scope of the present invention. For example, another embodiment exists wherein the initial metal layer 310 is blanket deposited over the initial spacer layer 140. As the initial metal layer 310 is blanket deposited to an increased thickness, the initial metal layer 310 substantially, if not completely, fills the openings 210 in the initial spacer layer 140. The blanket deposited initial metal layer 310 may then be planarized in a manner similar to that discussed above, resulting in the appropriate thickness for the initial metal layer 310. Advantageous to this embodiment, the openings 210 would remain filled with the initial metal layer 310. Accordingly, the initial metal layer 310 would experience improved electrical/mechanical integrity, especially at the vias formed within the openings 210.

Figure 10:
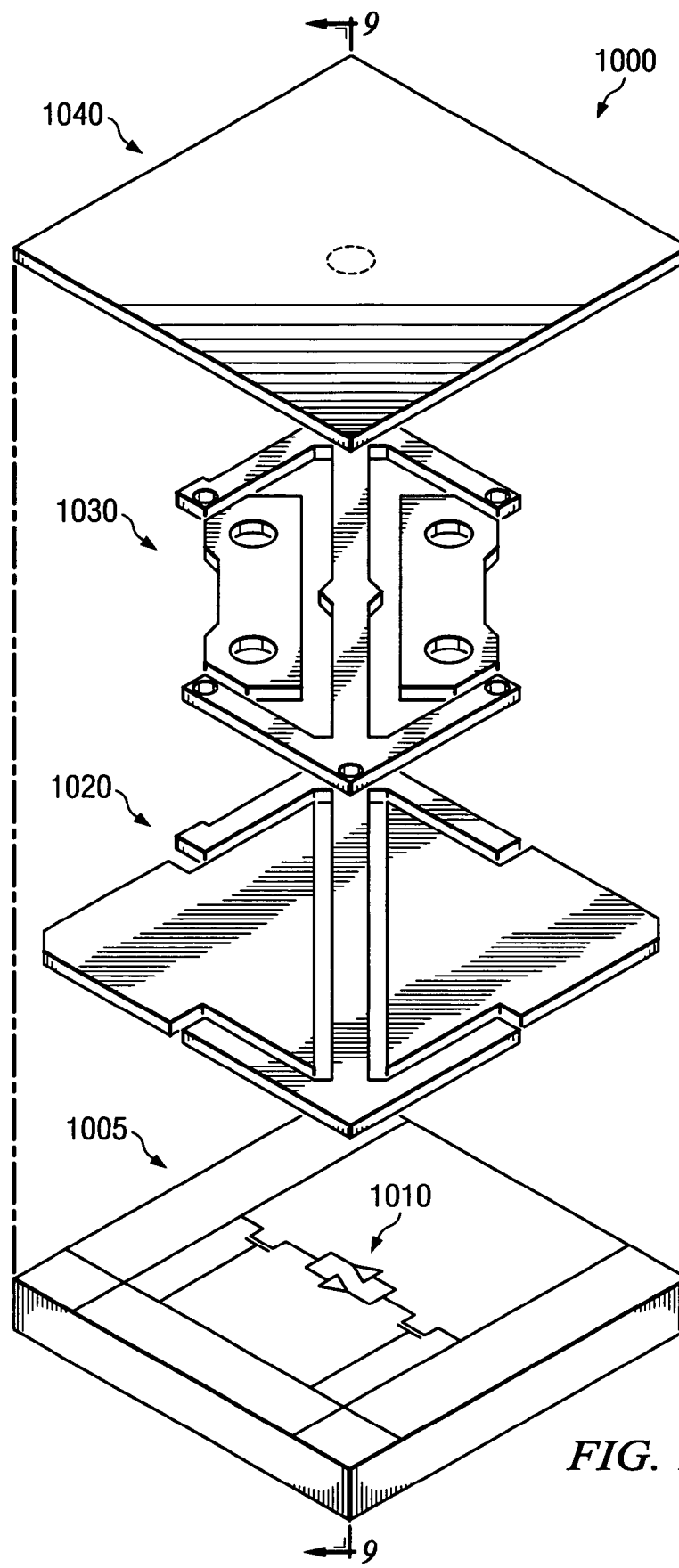
FIG. 10 illustrates an exploded view of a completed micro pixel array manufactured in accordance with the principles of the present invention.

Turning finally to FIG. 10, illustrated is an exploded view of a completed micro pixel array 1000 manufactured in accordance with the principles of the present invention. The micro pixel array 1000 illustrated in FIG. 10 includes, among other elements, a semiconductor substrate 1005 having control circuitry 1010 located therein, a patterned conductive layer 1020 located over the control circuitry 1010, a patterned initial metal layer 1030 located over the patterned conductive layer 1020, and a patterned metal layer 1040 located over the patterned initial metal layer 1030. The semiconductor substrate 1005, control circuitry 1010, patterned conductive layer 1020, patterned initial metal layer 1030, and patterned metal layer 1040 are similar or slight variations of the semiconductor substrate 105, control circuitry 110, patterned conductive layer 130, patterned initial metal layer 410, and patterned metal layer 810, respectively, illustrated in FIG. 9. For example, when taking a sectional view through the line 9-9 of FIG. 10, a device substantially similar to the micro pixel array 100 illustrated in FIG. 9 might result.

Although the present invention has been described in detail, those skilled in the art should understand that they could make various changes, substitutions and alterations herein without departing from the spirit and scope of the invention in its broadest form.

What is claimed is:

1. A method for planarizing a metal layer, comprising:
    forming control circuitry on or in a semiconductor substrate;
    depositing a photoresist layer over the semiconductor substrate;
    forming a metal layer over the photoresist layer; and
    planarizing the metal layer using a chemical mechanical planarization process to leave a planarized metal layer extending over the photoresist layer.

2. The method as recited in claim 1 wherein the metal layer is formed on the photoresist layer.

3. The method as recited in claim 1 wherein the metal layer includes aluminum.

4. The method as recited in claim 1 wherein the metal layer is planarized without shearing the metal layer from the photoresist layer.

5. The method as recited in claim 1 wherein planarizing includes planarizing using a down force of less than about 4 psi.

6. The method as recited in claim 1 wherein planarizing includes planarizing using a down force ranging from about 0.5 psi to about 2.0 psi.

7. The method as recited in claim 1 wherein the metal layer includes a post extending into an opening in the photoresist layer.

8. The method as recited in claim 1 wherein the metal layer has a surface roughness, and the planarizing reduces the surface roughness.

9. The method as recited in claim 1 wherein the metal layer is a metal hinge layer used in a micro pixel array.

10. The method as recited in claim 1 wherein the metal layer is a metal mirror layer used in a micro pixel array.

11. The method as recited in claim 1 wherein the metal layer is 2000 nm or less thick.

12. The method as recited in claim 1 wherein the metal layer is 1000 nm or less thick.

13. A method for manufacturing a micro pixel array, comprising:
    forming control circuitry on or in a semiconductor substrate;
    forming a hinge over the control circuitry;
    forming a photoresist layer over the hinge;
    forming a metal layer over the photoresist layer, the metal layer having a surface roughness; and
    planarizing the metal layer using a chemical mechanical planarization process, the planarizing reducing the surface roughness and leaving a planarized metal layer extending over the photoresist layer.

14. The method as recited in claim 13 wherein the metal layer is formed on the photoresist layer.

15. The method as recited in claim 13 wherein the metal layer includes aluminum.

16. The method as recited in claim 13 wherein the metal layer is planarized without shearing the metal layer from the photoresist layer.

17. The method as recited in claim 13 wherein planarizing includes planarizing using a down force of less than about 4 psi.

18. The method as recited in claim 13 wherein planarizing includes planarizing using a down force ranging from about 0.5 psi to about 2.0 psi.

19. The method as recited in claim 13 wherein forming a hinge over the control circuitry includes forming an initial spacer layer over the control circuitry, patterning the initial spacer layer, forming an initial metal layer over the patterned initial spacer layer, and patterning the initial metal layer resulting in the hinge.

20. The method as recited in claim 19 wherein forming the photoresist layer over the hinge includes depositing the photoresist layer over the hinge and patterning an opening in the deposited photoresist layer.

21. The method as recited in claim 20 wherein forming the metal layer over the photoresist layer further includes forming the metal layer over the photoresist layer and within the opening.

22. The method as recited in claim 21 further including patterning the planarized metal layer and then removing the initial photoresist layer and the photoresist layer.

* * * * *